United States Patent
Yoshino

(10) Patent No.: US 7,030,710 B2
(45) Date of Patent: Apr. 18, 2006

(54) OSCILLATOR CIRCUIT AND SEMICONDUCTOR INTEGRATED CIRCUIT DEVICE

(75) Inventor: Masaki Yoshino, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 28 days.

(21) Appl. No.: 10/895,916

(22) Filed: Jul. 22, 2004

(65) Prior Publication Data

US 2005/0030111 A1 Feb. 10, 2005

(30) Foreign Application Priority Data

Aug. 4, 2003 (JP) .............................. 2003-285936

(51) Int. Cl.
*H03B 5/02* (2006.01)
(52) U.S. Cl. ............ 331/158; 331/116 R; 331/116 FE; 331/185
(58) Field of Classification Search ................ 331/158, 331/116 R, 116 FE, 185
See application file for complete search history.

(56) References Cited

U.S. PATENT DOCUMENTS 6,408,353 B1   6/2002 Sakairi 6,927,641 B1 * 8/2005 Terasawa et al. ........... 331/158

FOREIGN PATENT DOCUMENTS

JP          1-261007 A    10/1989
JP       2000-112921 A     4/2000

* cited by examiner

*Primary Examiner*—Arnold Kinkead
(74) *Attorney, Agent, or Firm*—Foley & Lardner LLP

(57) ABSTRACT

An oscillator circuit includes a crystal oscillating circuit for generating a clock signal using a crystal resonator, an RC oscillating circuit for generating the clock signal using an RC circuit, a control signal generation circuit for bringing one of terminals for the external component to a ground potential in response to input of a reset signal, changeover switches for connecting the crystal oscillating circuit to the crystal resonator in parallel upon receipt of a first signal and connecting the RC oscillating circuit to a resistive element in the RC circuit in response to a second signal, and a selection signal generation circuit connected to the other terminal of the external component upon receipt of the reset signal, for transmitting the first signal to the changeover switches when a current flowing through the external component is smaller than a predetermined value and transmitting the second signal to the changeover switches when the current is equal to or more than the predetermined value.

12 Claims, 12 Drawing Sheets

OSCILLATOR CIRCUIT AND SEMICONDUCTOR INTEGRATED CIRCUIT DEVICE

FIELD OF THE INVENTION

The present invention relates to an oscillator circuit for generating a clock signal using a crystal resonator or an RC circuit, and a semiconductor integrated circuit device provided with it.

BACKGROUND OF THE INVENTION

Conventionally, in semiconductor integrated circuit devices (which will be hereinafter referred to as "semiconductor devices") such as a microcomputer, in order to supply a clock signal to a circuit that uses the clock signal, there are a case where a crystal resonator is used as an external component of the semiconductor device and a case where an RC (resistive element and capacitor element) circuit is used as the external component. As described above, oscillators can be broadly classified into two types: a crystal oscillator that uses a crystal resonator and an RC oscillator that uses a RC circuit. Though the crystal oscillator has an advantage that it has a high accuracy of oscillation frequency, it is necessary to mount a rather expensive crystal resonator as the external component. Thus, its price becomes high. On contrast therewith, the RC oscillator uses the RC circuit in place of the crystal resonator. Thus, its price becomes inexpensive, but the accuracy of oscillation frequency is low.

Since each of the oscillators has the characteristics as described above, it is desirable that the user of the semiconductor devices can select the oscillator according to his application. The respective oscillators, however, have different principles of oscillation. Thus, in order to enable the oscillator to be operated, a dedicated oscillating circuit becomes necessary. For this provision, following two methods can be considered.

The first method is to fabricate the semiconductor devices suited for the type of the oscillator. In this case, there is the need to fabricate two types of the semiconductor devices.

The second method is to include oscillating circuits suited for the respective oscillators in one semiconductor device and enable selection of one of the oscillators in some way. In this case, fabrication of just one type of the semiconductor devices suffices.

In view of the number of man-hours for development, a development period, and costs, the second method that needs less types of products for development is more desirable than the first method. The challenge in the second method is how to make oscillator selection. As its easy method, a configuration can be conceived in which connection terminals for connecting elements required for the operation of the oscillators are provided, and the semiconductor device selects the oscillator according to each of the elements connected to the connection terminals.

However, in this method, in addition to two connection terminals for connecting each of the external components, an additional connection terminal becomes necessary in order to input a signal for operating each of the oscillating circuits for the external components. When a package with a small number of pins, which will become the connection terminals, is used, this method is not desirable. For this reason, the method in which the number of the connection terminals for use is limited to the fewest possible two terminals to permit selection of either of the two oscillators is strongly demanded. There is disclosed an example of the oscillator circuit for implementing this method (refer to Patent Document 1, for example).

The conventional oscillator circuit described above will be described.

FIG. 9 is a circuit diagram showing a configuration of the conventional oscillator circuit.

As shown in FIG. 9, the oscillator circuit includes connection terminals 10a and 10b for connecting a crystal resonator or an RC circuit as the external component, a circuit for crystal oscillation (termed as "a crystal oscillating circuit") 12 which causes the crystal resonator to operate, a circuit for RC oscillation (termed as "an RC oscillating circuit") 18 which generates a clock signal using the RC circuit, a transistor (Tr-A) for control signal 14 for outputting a control signal, and a comparator 16 for outputting an oscillator selection signal that is the signal for selecting the oscillating circuit according to a difference between the external components. The oscillator circuit further includes an inverter 75 and gates 71 to 74 for connecting the crystal oscillating circuit 12 or the RC oscillating circuit 18 to the connection terminal 10a and 10b in response to an oscillator selection signal output from the comparator 16. A resistive element in the RC circuit connected to the connection terminals 10a and 10b will be hereinafter referred to as external resistive element. Meanwhile, the crystal resonator which is connected across the terminals 10a and 10b as the external component and the crystal oscillating circuit 12 compose a crystal oscillator and the RC circuit which is connected across the terminals 10a and 10b as the external component and the RC oscillating circuit 18 compose an RC oscillator.

To the comparator 16, the potential at the connection node between the drain electrode of the transistor for control signal 14 and the connection terminal 10a is supplied as an input potential V1. The value of the input potential V1 differs, depending on the case where the external component is the crystal resonator or the RC circuit.

The comparator 16 determines whether the input potential V1 is larger than a preset reference voltage SV or not. If the input potential V1 is smaller, the comparator 16 outputs the oscillator selection signal at a High level. On the contrary, if the input potential V1 is larger, the comparator 16 outputs the oscillator selection signal at a Low level. When the oscillator selection signal output from the comparator 16 is at the High level, the gates 71 and 72 are turned on to connect the crystal oscillating circuit 12 to the connection terminals 10a and 10b. When the oscillator selection signal output from the comparator 16 is at the Low level, the oscillator selection signal passes through the inverter 75. The signal at the High level is thereby supplied to the gates 73 and 74. Then, the gates 73 and 74 are turned on to connect the RC oscillating circuit 18 to the connection terminals 10a and 10b.

When the ON resistance of the transistor for control signal 14 is indicated by Rn, the resistance of the external resistive element is indicated by Rb, and the resistance of a feedback resistance RA of the crystal oscillating circuit 12 is indicated by Ra, the relationship among the resistances Rn, Rb, and Ra generally becomes Rn<<Rb<Ra.

Next, an operation of the oscillator circuit described above will be described. Since configurations of the RC oscillating circuit 18 and the gates 71 to 74 are the same as those in FIG. 9, illustration of them will be omitted.

FIG. 10a is a diagram for explaining the operation of the oscillator circuit when the crystal resonator is connected thereto as the external component so as to operate the crystal oscillator.

As shown in FIG. 10a, when a crystal resonator Q is connected to the connection terminals 10a and 10b as the external component to turn on the transistor for control signal 14, the input potential V1 to the comparator 16 is comparable to the ground potential GND (which will be simply referred to as GND) level because of the relationship of Rn<<Ra, and becomes smaller than a reference voltage SV. For this reason, the oscillator selection signal output from the comparator 16 goes High. On receipt of the oscillator selection signal at the High level, the gates 71 and 72 are turned on to connect the crystal oscillating circuit 12 to the control terminals 10a and 10b. The crystal oscillating circuit 12 is thereby operated.

FIG. 10b is a diagram for explaining the operation of the oscillator circuit when the RC circuit is connected thereto as the external component so as to operate the RC oscillator.

As shown in FIG. 10b, an external resistive element RB of the RC circuit is connected across the connection terminals 10a and 10b as the external component. Further, one of the terminals of a capacitor C is connected to the connection terminal 10a, and the other terminal is connected to GND. When the transistor for control signal 14 is then turned on, the input potential V1 becomes close to the GND level because of the relationship of Rn<<Rb. However, since Rb<Ra holds, a current path occurs in the external resistive element RB. Thus, compared with the case where the crystal resonator Q is connected as the external component, the value of the input potential V1 becomes larger than the reference voltage SV. For this reason, the oscillator selection signal output from the comparator 16 goes Low. Upon receipt of the signal that has passed through the inverter 75, the gates 73 and 74 are turned on, thereby to connect the RC oscillating circuit 18 to the connection terminals 10a and 10b. The RC oscillating circuit 18 is thereby operated.

As described above, by setting the reference voltage SV so that the oscillator selection signal from the comparator 16 differs depending on the case where the crystal resonator Q is connected as the external component or the case where the RC circuit is connected as the external component, selection of each of the oscillators becomes possible.

[Patent Document 1]
Japanese Patent Kokai Publication No. JP-A-1-261007

SUMMARY OF THE DISCLOSURE

A difference in the input potentials to the comparator caused by a difference in the external components is very small in view of a potential error produced when the external components are mounted on the semiconductor device. Further, since the input potentials in both cases are close to the GND level, there is some possibility that only a slight deviation in the input potential might cause an erroneous oscillator selection signal to be output from the comparator.

Further, in the determination method of the conventional technique, there is the need for considering the resistance of the external resistive element as well. Thus, there is also the problem that the user cannot use an arbitrary external resistive element. The value of the input potential to the comparator will be described, taking the resistance Rb of a typical external resistive element as an example. Incidentally, the ON resistance Rn of the transistor for control signal 14 is several kilo-ohms, and the feedback resistance Ra of the crystal oscillating circuit 12 is several mega-ohms. The value of the input potential when the crystal resonator is connected as the external component is further shown, for comparison. Still further, the capacitance of the capacitor C is assumed to be fixed.

Table 1 shows the input potentials to the comparator when Rn is set to 5 kΩ, Rb is set to 500 kΩ, and Ra is set to 5000 kΩ, and the input potentials when the crystal resonator is connected.

TABLE 1

| | Operating Voltage | | |
|---|---|---|---|
| | 5 V | 3 V | 2 V |
| RC Circuit Connected (Slightly Higher Potential) | 50 mV | 30 mV | 2 mV |
| Crystal resonator Connected (Approx. GND Potential) | 5 mV | 3 mV | 2 mV |

As shown in Table 1, even if the operating voltage is set to 5V, it can be seen that a difference between the input potentials is 50−5=45 mV.

Next, the case where Rb of the external resistive element Rb is reduced. Table 2 shows the input potentials to the comparator when Rn is set to 5 kΩ, Ra is set to 5000 kΩ, and Rb is set to 200 kΩ, and the input potentials to the comparator when the crystal resonator is connected.

TABLE 2

| | Operating Voltage | | |
|---|---|---|---|
| | 5 V | 3 V | 2 V |
| RC Circuit Connected (Slightly Higher Potential) | 122 mV | 73 mV | 49 mV |
| Crystal resonator Connected (Approx. GND Potential) | 5 mV | 3 mV | 2 mV |

As shown in Table 2, when the operating voltage is set to 5V, a difference between the input potentials becomes 122−5=117 mV. Thus, the difference becomes two times or more the difference in the case where the resistance Rb of the external resistive element is set to 500 kΩ.

Next, a description will be given about the case where Rb of the external resistive element is further reduced. Table 3 shows the input potentials to the comparator when Rn is set to 5 kΩ, Ra is set to 5000 kΩ, and Rb is set to 100 kΩ, and the input potentials to the comparator when the crystal resonator is connected.

TABLE 3

| | Operating Voltage | | |
|---|---|---|---|
| | 5 V | 3 V | 2 V |
| RC Circuit Connected (Slightly Higher Potential) | 238 mV | 143 mV | 95 mV |
| Crystal resonator Connected (Approx. GND Potential) | 5 mV | 3 mV | 2 mV |

As shown in Table 3, a difference between the input potentials becomes 238−5=233 mV when the operating voltage is set to 5V. Thus, the difference becomes five times or more the difference in the case where Rb of the external resistive element is set to 500 kΩ, and becomes approximately twice as large as in the case where Rb is set to 200 kΩ.

As shown in the above Tables 1 to 3, the smaller the resistance of the external resistive element becomes, the larger the difference between the input potentials becomes. From this, it can be seen that the resistance of the external resistive element should be reduced in order to facilitate determination by the comparator. However, in connection with the threshold voltage of an inverter 20 in the crystal oscillating circuit 12, the resistance of the external resistive element cannot be reduced from a certain value for the following reason.

FIG. 11 is a diagram for explaining the input potential to the comparator 16 in the case where the RC circuit is connected as the external component.

When the resistance of the external resistance element RB is small, the voltage of the input potential V1 is made too large and then exceeds the threshold voltage of the inverter 20, the output signal of the inverter 20 goes Low. As a result, the voltage of the input potential V1 becomes approximately the GND level, so that the oscillator selection signal from the comparator 16 goes High. As described above, though the RC circuit is connected as the external component, the oscillator selection signal for operating the crystal oscillating circuit 12 is output from the comparator 16. For this reason, when the RC circuit is connected, it must be so arranged that the input potential V1 does not exceed the threshold voltage of the inverter 20.

From the foregoing description, it is necessary that a lower limit for the resistance of the external resistive element RB mounted on the oscillator circuit should be provided and that the reference voltage for the comparator 16 should satisfy the following three conditions.

FIG. 12 is a graph showing setting conditions of the reference voltage for the comparator. The vertical axis indicates voltage.

As shown in FIG. 12, as the first condition, a reference voltage Vb should be smaller than the threshold voltage V20 of the inverter 20. As the second condition, the reference voltage Vb should be smaller than an input potential Vr to the comparator 16, which is generated when the external resistive element is connected. As the third condition, the reference voltage Vb should be larger than an input potential Vg to the comparator 16, which is generated when the crystal resonator is connected.

Further, the voltage supplied to the interior circuits inside the semiconductor device tends to be lowered for the purposes of chip shrinkage, reduction in current consumption, and noise reduction, and the like. For this reason, a difference between GND and the threshold voltage V20 of the inverter 20 tends to be reduced. Thus, the accuracy of setting the reference voltage is increasingly demanded, so that it becomes more difficult to mount the external components conforming to various standards on the semiconductor device.

Now, examples of a reference voltage set value will be shown. Table 4 shows the range of the input potential with respect to the operating voltages when the crystal resonator or the RC circuit is connected as the external component. Incidentally, the reference voltage set value is the optimized value of the resistance of the external resistive element (maximum value not exceeding the threshold value of the inverter 20). Further, the "binary voltage range" refers to the range of the input potential V1 of the circuit shown in FIG. 9. The threshold voltage of the inverter 20 is set to the (operating voltage/2)±10%.

TABLE 4

| Operating Voltage | Threshold Voltage of Inverter 20 | Binary Voltage Range | Reference Voltage Set Value |
|---|---|---|---|
| 5 V | 2.5 V ± 0.25 V | 2.25 V | 1.125 V ± several % |
| 3 V | 1.5 V ± 0.15 V | 1.35 V | 0.675 V ± several % |
| 2 V | 2.5 V ± 0.25 V | 0.90 V | 0.450 V ± several % |

As shown in Table 4, when the operating voltage is set to 5V, the threshold voltage of the inverter 20 becomes 2.5V±0.25V, and the binary voltage range becomes from the GND level (≈0V) to the minimum threshold voltage of 2.25 V of the inverter 20. Then, the reference voltage set value becomes the central value of the binary voltage range. Thus, the reference voltage set value becomes 1.125V, and the error of the set value becomes ± several %. The same holds true for other operating voltages.

In order to increase the binary voltage range as in the examples shown in Table 4, the resistance of the external resistive element must be made close to the optimized value. Further, even if the resistance of the external resistive element is optimized to increase the binary voltage range, the reference voltage must be a predetermined voltage within that range.

Accordingly, it is an object of the present invention to provide an oscillator circuit enabling a stable clock signal to be generated from a crystal resonator or an RC circuit connected as an external component, and a semiconductor integrated circuit device provided with it.

The above and other objects are attained by an oscillator circuit, in accordance with one aspect of the present invention, with an RC circuit or a crystal resonator connected thereto as an external component, for generating a clock signal using the RC circuit or the crystal resonator, the RC circuit being constituted from a resistive element and a capacitor element, which includes:

a crystal oscillating circuit for being connected in parallel with said crystal resonator, for generating the clock signal using said crystal resonator;

an RC oscillating circuit for being connected in parallel with said resistive element, for generating the clock signal using said RC circuit;

a control signal generation circuit for bringing one terminal of said external component to a ground potential in response to input of a reset signal;

changeover switches for connecting said crystal oscillating circuit to said crystal resonator in parallel upon receipt of a first signal and connecting said RC oscillating circuit to said resistive element in parallel upon receipt of a second signal, said first signal being a selection signal for operating said crystal oscillating circuit and said second signal being a selection signal for operating said RC oscillating circuit; and a selection signal generation circuit for supplying the first signal to said changeover switches when a current flowing through said external component is less than a predetermined value and supplying the second signal to said changeover switches when the current is not less than the predetermined value, said selection signal generation circuit being connected to the other terminal of said external component in response to input of the reset signal.

In the present invention, in response to input of the reset signal, one terminal of the external component is brought to the ground potential, and the other terminal of the external component is connected to the selection signal generation circuit. Thus, a current path from the selection signal generation circuit to the ground potential through the external component is formed. When the external component is the crystal resonator, little current flows through the external component. Thus, the current becomes smaller than the predetermined value, so that the selection signal generation circuit transmits the first signal to the changeover switches. Then, upon receipt of the first signal, the changeover switches connect the crystal oscillating circuit to the crystal resonator in parallel, so that a crystal oscillator becomes operative. On the other hand, when the external component is the RC circuit, the current flowing through the resistive element becomes larger than the predetermined value. Thus, the selection signal generation circuit transmits the second signal to the changeover switches. Then, upon receipt of the second signal, the changeover switches connect the RC oscillating circuit to the resistive element in parallel. Then, an RC oscillator becomes operative.

In the oscillator circuit according to the present invention, the selection signal generation circuit may comprise:

a first transistor with a power supply potential applied to a drain electrode thereof, with a source electrode thereof connected to the other terminal of the external component, and with a gate electrode thereof connected to the source electrode;

a second transistor with the power supply potential applied to a drain electrode thereof, with a source electrode thereof connected to the changeover switches, and a gate electrode thereof connected to the gate electrode of the first transistor; and a third transistor with a drain electrode thereof connected to the source electrode of the second transistor, a source electrode thereof connected to the ground potential, and with a reference voltage applied to a gate electrode thereof, the reference voltage becoming a voltage for turning on the third transistor.

In the present invention, when the external component is the crystal resonator, the crystal resonator becomes an electrically large resistance. Thus, no current path occurs in the first transistor. For this reason, the potential at the source electrode of the second transistor is pulled to the third transistor in an ON state, and becomes the potential close to the ground potential. Thus, the selection signal generation circuit transmits the first signal with the potential close to the ground potential to the changeover switches. On the other hand, when the external component is the RC circuit, the resistance of the resistive element is smaller than the crystal resonator, so that the current path occurs in the first transistor. When the current path occurs in the first transistor, the second transistor tries to pass the current with the same value as the current in the first transistor. For this reason, the potential at the drain electrode of the third transistor is pulled to the second transistor to become the potential close to the power supply potential. Thus, the selection signal generation circuit transmits the second signal with a potential close to the power supply potential to the changeover switches.

In the oscillator circuit according to the present invention, the reference voltage may have a value exceeding the threshold voltage of the third transistor.

In the present invention, the reference voltage applied to the gate electrode of the third transistor should only exceed the threshold voltage. Thus, the set margin of the reference voltage is more increased than in the prior art.

The oscillator circuit according to another aspect of the present invention, further includes a latch circuit for holding the selection signal provided between the selection signal generation circuit and the changeover switches.

Since the latch circuit for holding the selection signal is provided between the selection signal generation circuit and the changeover switches, the changeover switches operate according to the selection signal output from the latch circuit even if the reset signal is turned off. Thus, the oscillator suited for the external component becomes operative.

The oscillator circuit according to still another aspect of the present invention, further includes a timer for providing a standby time for the operation of a clock signal utilization circuit until the clock signal is stabilized. The clock signal utilization circuit is a circuit for utilizing the clock signal.

In the present invention, after the crystal oscillator using the crystal resonator or the RC oscillator using the RC circuit has started operation, the clock signal utilization circuit is kept from operating until the clock signal is stabilized. Thus, the occurrence of a malfunction of the clock signal utilization circuit is suppressed.

In the oscillator circuit according to the present invention, the timer may include:

a timer setting circuit for storing set count values of the standby time and specifying one of the set count values in response to the selection signal received, the set count values being different according to whether the external component is the crystal resonator or the RC circuit;

a counter for obtaining the number of counts of the clock signal; and a comparator for checking whether the number of counts matches the one of the set count values and transmitting to the clock signal utilization circuit a signal for starting the operation of the clock signal utilization circuit when the one of the set count values matches the number of counts.

In the present invention, the timer setting circuit specifies either of the set count values that are different between the crystal oscillator that uses the crystal resonator and the RC oscillator that uses the RC circuit, in response to the selection signal received. The comparator compares the specified set count value with the number of counts. Since the set count value matches the number of counts when the standby time is reached in which the oscillator is stabilized, the comparator transmits the signal for starting the operation of the clock signal utilization circuit.

Further, in the oscillator circuit according to the present invention, when the selection signal is the first signal, the set count value may be larger than the set count value when the selection signal is the second signal.

In the present invention, it needs a longer time for the oscillating waveform of the crystal oscillator that uses the crystal resonator to be stabilized than with the RC oscillator that uses the RC circuit. Thus, by making the set count value of the crystal oscillator larger than the set count value of the RC oscillator, the need for providing an additional standby time for the RC oscillator is eliminated.

On the other hand, a semiconductor integrated circuit device for achieving the above-mentioned object includes:

any one of the oscillator circuits described above; and connection terminals for connecting the external component thereto.

Since the present invention includes any one of the oscillator circuits described above and the connection terminals for connecting the external component thereto, the oscillator suited for the external component operates stably. Thus, the occurrence of a malfunction of the clock signal utilization circuit in the semiconductor integrated circuit device can be more suppressed.

The meritorious effects of the present invention are summarized as follows.

Since the present invention is configured as described above, the following effects are achieved.

In the present invention, the set margin of the reference voltage for selecting the oscillator is increased. Thus, the reference voltage can be set easily, and the occurrence of malfunction of the oscillator circuit is more reduced.

Further, in view the relationship between the operating voltage of the semiconductor device and the range of the reference voltage, when the operating voltage is reduced in the prior art, mounting becomes difficult. On contrast therewith, since the range of the reference voltage is wide in the present invention, the invention can also accommodate reduction of the operating voltage.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
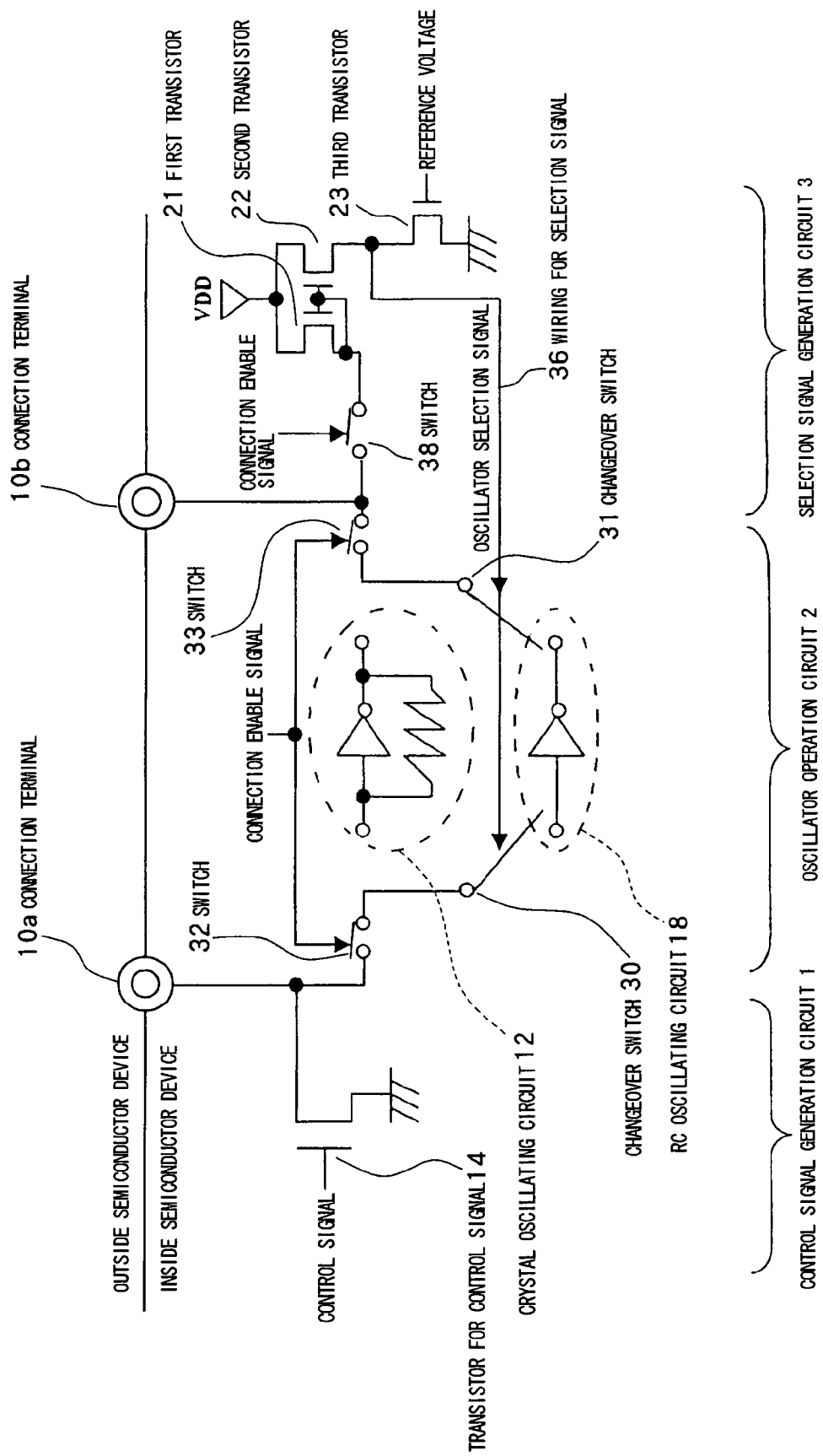
FIG. 1 is a circuit diagram showing an example of a configuration of an oscillator circuit according to the present invention.

Preferred embodiments of the present invention will now be described with reference to the drawings. An oscillator circuit according to the present invention is characterized in that which one of a crystal resonator and an RC circuit is connected as an external component can be determined by whether a current path is present or not.

First Embodiment

A configuration of an oscillator circuit according to the first embodiment of the present invention will now be described. The same reference numerals are assigned to the configurations that are the same as those in the prior art, and their detailed descriptions will be omitted.

FIG. 1 is a circuit diagram showing an example of the configuration of the oscillator circuit according to the first embodiment of the present invention.

As shown in FIG. 1, the oscillator circuit includes a control signal generation circuit 1 for generating a reset signal for selecting an oscillating circuit, an oscillator operation circuit 2 for operating an oscillator, and a selection signal generation circuit 3 for generating an oscillator selection signal, which is the signal for selecting the oscillating circuit in response to a reset signal.

The control signal generation circuit 1 includes a transistor for control signal 14 necessary for forming a current path, as in the circuit configuration of the prior art.

The oscillator operation circuit 2 includes a circuit for crystal oscillation (termed as "a crystal oscillating circuit") 12 for causing a crystal oscillator to operate using a crystal resonator (not shown) to generate a clock signal, a circuit for RC oscillation (termed as "an RC oscillating circuit") 18 for operating an RC oscillator using an RC circuit (not shown) to generate a clock signal, changeover switches 30 and 31 for connecting the crystal oscillating circuit 12 or the RC oscillating circuit 18 to connection terminals 10a and 10b, and switches 32 and 33 for disconnecting the crystal oscillating circuit 12 and the RC oscillating circuit 18 from the circuit. Provision of the switches 32 and 33 is to cause an output signal from an inverter in the crystal oscillating circuit 12 not to disturb the operation of the selection signal generation circuit 3 and also not to generate a current path through a feedback resistance.

The changeover switches 30 and 31 are connected to the selection signal generation circuit 3 through a wiring for selection signal 36. Upon receipt of the oscillator selection signal at an Low level through the wiring for selection signal 36 from the selection signal generation circuit 3, the changeover switches 30 and 31 connect the crystal oscillating circuit 12 to the connection terminals 10a and 10b. Upon receipt of the oscillator selection signal at a High level, the changeover switches 30 and 31 connect the RC oscillating circuit 18 to the connection terminals 10a and 10b.

The selection signal generation circuit 3 includes a switch 38 for establishing connection with the oscillator operation circuit 2 during the input period of the reset signal, and a first transistor 21, a second transistor 22, and a third transistor 23, all for generating the oscillator selection signal. In this embodiment, the first transistor 21, second transistor 22, and third transistor 23 are N-channel transistors.

The first transistor 21 has its source electrode connected to the switch 38, and to its drain electrode, a power supply potential VDD is applied. The second transistor 22 has its source electrode connected to the drain electrode of the third transistor and the wiring for selection signal 36, and to its drain electrode, the power supply potential VDD is applied. Gate electrodes of the first transistor 21 and the second transistor 22 are connected to the source electrode of the first transistor 21. The source electrode of the third transistor 23 is connected to GND. Then, a reference voltage is applied to a gate electrode of the third transistor 23.

Driving capabilities of the first transistor 21 and the second transistor 22 are larger than the driving capability of the third transistor 23. In this embodiment, by increasing the width of an active region (channel width) in the transistor, through which a channel passes, the driving capability is increased.

When the crystal resonator is connected to the connection terminals 10a and 10b, the crystal resonator becomes an extremely large resistance that is electrically equivalent to an LCR (including an inductor, a capacitor, and a resistance) connected in series. Accordingly, the current path scarcely occurs in the first transistor 21 of the selection signal generation circuit 3. Thus, a potential V3 is pulled to the third transistor 23 in an ON state and then becomes the potential close to GND level. Thus, the selection signal generation circuit 3 transmits the oscillator selection signal at a Low level to the changeover switches 30 and 31 through the wiring for selection signal 36.

On the other hand, when an external resistive element is connected to the connection terminals 10a and 10b and a capacitor C is connected between the connection terminal 10a and GND, the current path occurs in the first transistor 21 in the selection signal generation circuit 3 because the resistance of the external resistive element is smaller than the resistance of the crystal resonator. Thus, the current exceeding a predetermined value flows through the first transistor 21. When the current path occurs in the first transistor 21, the second transistor 22 tries to pass the current having the same value as the current in the first transistor 21. For this reason, the potential V3 is pulled to the second transistor 22 and then becomes the potential close to the power supply potential VDD. Thus, the selection signal generation circuit 3 transmits the oscillator selection signal at a High level to the changeover switches 30 and 31 through the wiring for selection signal 36.

As described above, the selection signal generation circuit 3 generates the oscillator selection signal at the Low level, which is the GND level, or the oscillator selection signal at the High level, which is the VDD level, according to a difference of whether an external component is the crystal resonator or the RC circuit.

Next, an operating procedure of the above-mentioned oscillator circuit when the crystal resonator is connected as the external component so as to operate the crystal oscillator will be described.

Figure 2A:
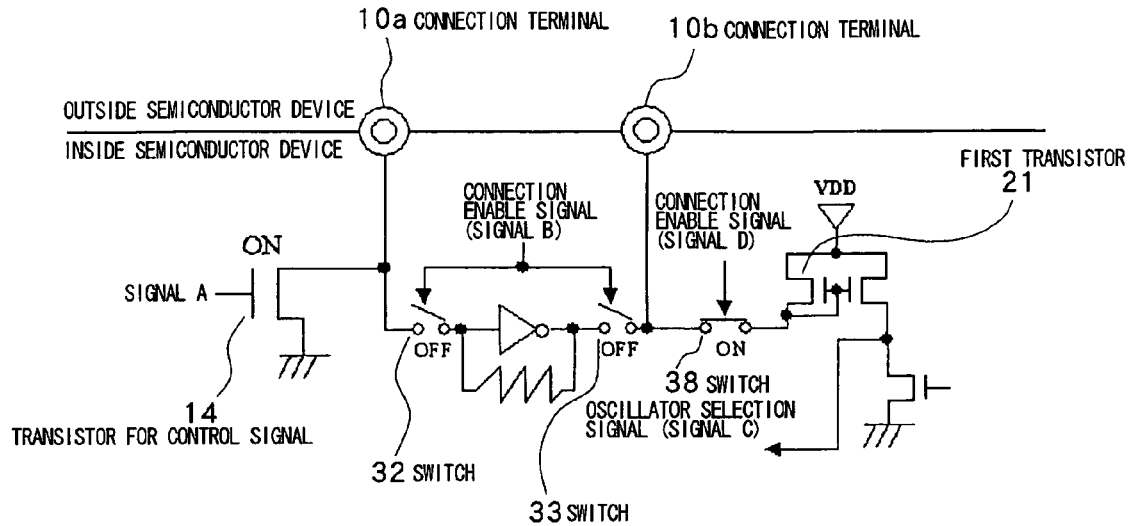
FIGS. 2a and 2b include diagrams for explaining an operating procedure of the oscillator circuit according to the present invention.
Figure 2B:
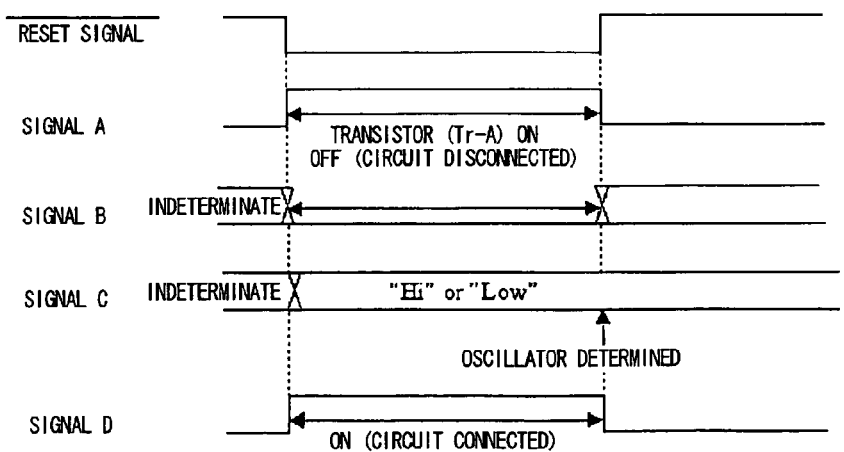
Figure 3A:
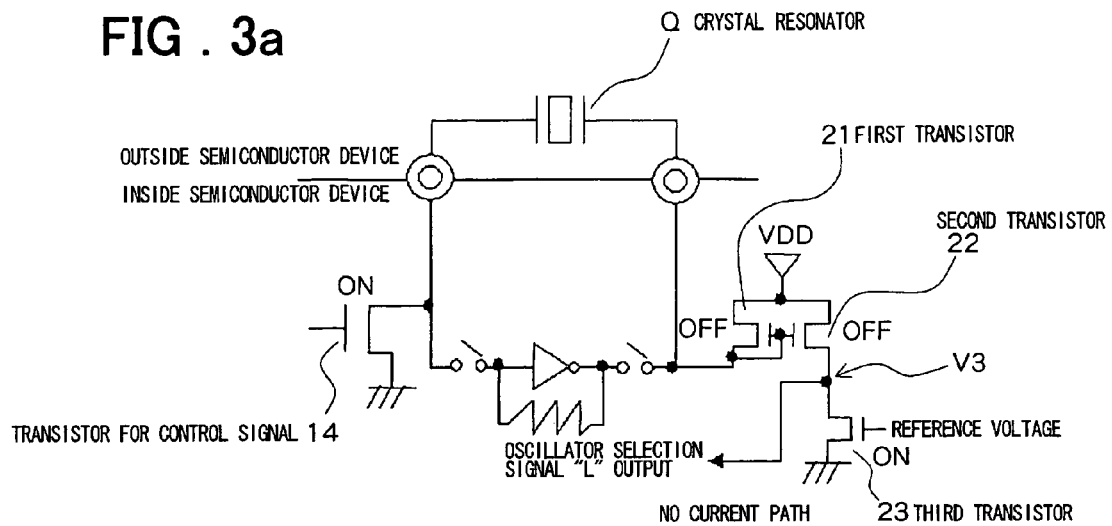
FIGS. 3a and 3b include schematic diagrams showing an operation when a crystal resonator is connected and an operation when an RC circuit is connected.

FIG. 2a is a schematic diagram showing the state of the oscillator circuit when the reset signal has been input, and FIG. 2b is a timing diagram showing the operating procedure of the oscillator circuit. Further, FIG. 3a is a schematic diagram showing the operation of the oscillator circuit when the crystal resonator is connected. Since the configurations of the RC oscillating circuit 18 and the changeover switches 30 and 31 are the same as those shown in FIG. 1, illustration of them will be omitted below.

When the reset signal is input by operation of an operator as shown in FIGS. 2a and 2b after a crystal resonator Q as an external component is connected to the connection terminals 10a and 10b, a signal D for connecting the connection terminal 10b to the selection signal generation circuit 3 becomes active. Then, the switch 38 controlled by the signal D is turned on, so that the source electrode of the first transistor 21 is connected to the connection terminal 10b. A signal B for connecting the oscillating circuit to the connection terminals 10a and 10b then becomes inactive, and the switches 32 and 33 controlled by the signal B are turned off, thereby separating the oscillating circuit from the connection terminals 10a and 10b. Then, in order to form the current path, the transistor for control signal 14 is turned on, so that the connection terminal 10a has a potential close to the GND level. The signal B shown in FIG. 2(b) shows the signal in the circuit diagram shown in FIG. 1.

Since the crystal resonator Q is connected as the external component, and the crystal resonator Q has the extremely large resistance, the current path does not occur in the path from VDD to GND through the crystal resonator Q. For this reason, as shown in FIG. 3(a), the potential V3 of the selection signal generation circuit 3 is pulled to the third transistor 23 in the ON state to become the potential close to the potential at GND. Thus, the selection signal generation circuit 3 transmits the oscillator selection signal at the Low level to the changeover switches 30 and 31 through the wiring for selection signal 36. Upon receipt of the oscillator selection signal at the Low level from the selection signal generation circuit 3, the changeover switches 30 and 31 connects the crystal oscillating circuit 12 to the connection terminals 10a and 10b.

Next, an operating procedure of the above-mentioned oscillator circuit when the RC circuit is connected as the external component so as to operate the RC oscillator will be described.

Figure 3B:
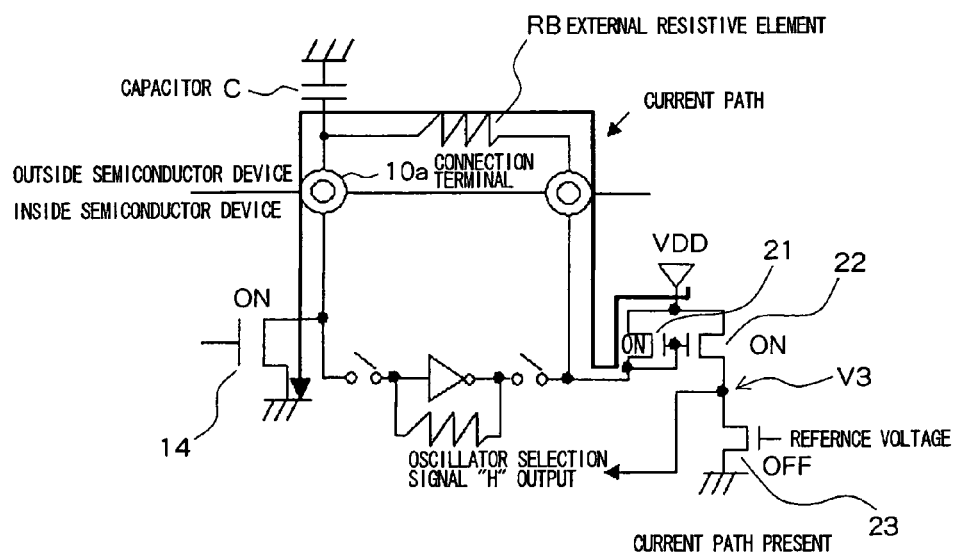

FIG. 3b is a schematic diagram showing the operation of the oscillator circuit when the RC circuit is connected.

An external resistive element RB of the RC circuit is connected to the connection terminals 10a and 10b as an external component. Further, one terminal of the capacitor C is connected to the connection terminal 10a, and the other terminal is connected to the GND. Then, when the reset signal is input by operation of the operator, the switch 38 controlled by the signal D is turned on, as in the case where the crystal resonator Q is connected. Then, the source electrode of the first transistor 21 is connected to the connection terminal 10b, and the switches 32 and 33 controlled by the signal B are turned off, thereby separating the oscillating circuit from the connection terminals 10a and 10b. Then, in order to form the current path, the transistor for control signal 14 is turned on, so that the potential of the connection terminal 10a is close to the GND level.

Since the RC circuit is connected as the external component, the current path occurs in the path from VDD to GND through the external resistive element RB as shown in FIG. 3(b), so that the potential V3 of the selection signal generation circuit 3 is pulled up to the potential close to the VDD level. As a result, the selection signal generation circuit 3 transmits the oscillator selection signal at a High level to the changeover switches 30 and 31 through the wiring for selection signal 36. Upon receipt of the oscillator selection signal at the High level from the selection signal generation circuit 3, the changeover switches 30 and 31 connects the RC oscillating circuit 18 to the connection terminals 10a and 10b.

Next, results of comparison of the reference voltage between the prior art and the present invention will be described.

Table 5 is a table showing an example of a reference voltage range with respect to the operating voltages of a semiconductor device. For comparison, reference voltage set values of the prior art are shown in Table 5.

TABLE 5

| Operating Voltage | Prior Art | Present Invention |
| --- | --- | --- |
| 5 V | 1.125 V ± several % | 0.65 V or higher |
| 3 V | 0.675 ± several % | 0.55 V or higher |
| 2 V | 0.450 V ± several % | 0.45 V or higher |

As shown in Table 5, it can be seen that while the range of the reference voltage set values of the prior art is small, the reference voltage set values according to the present invention should only be larger than the threshold voltage of the third transistor 23.

In the prior art, there is the need to satisfy three conditions that the reference voltage should be smaller than the threshold voltage of the inverter in the crystal oscillating circuit 12 and a voltage generated when the external resistive element is connected, and should be larger than the voltage generated when the crystal resonator is connected. On contrast therewith, in the present invention, the reference voltage should only be set to a value equal to or more than the threshold voltage of the third transistor 23, as described above.

In the present invention, since the set margin of the reference voltage applied to the selection signal generation circuit 3 in the oscillator circuit increases, setting of the reference voltage is facilitated, so that the occurrence of a malfunction of the oscillator circuit is reduced.

Further, in view the relationship between the operating voltage of the semiconductor device and the range of the reference voltage, when the operating voltage is reduced in the prior art, mounting becomes difficult. On contrast therewith, since the range of the reference voltage is wide in the present invention, the present invention can also cope with the low voltage operation.

Further, when determination is made as to which one of the crystal resonator and the RC circuit is employed as the external component, the inverter in the crystal oscillating circuit is disconnected from the circuit. Thus, there is no need to take the threshold voltage of the inverter into consideration.

Further, in the prior art, by monitoring the potential that changes according to the resistance of the external resistive element in the RC circuit and comparing the potential with the reference voltage, the oscillator selection signal is determined. Thus, the resistance range of the external resistive element that can be used is limited. In the present invention, the oscillator selection signal is determined according to whether the current path occurs in the external component or not, and determination of the oscillator selection signal is not affected by the resistance of the external resistive element. Thus, the resistance range of the external resistive element becomes wider than in the prior art.

Further, the output level of the oscillator selection signal is the VDD level or the GND level irrespective of the resistance of the external resistive element. Thus, the occurrence of a malfunction is more reduced.

Second Embodiment

Another embodiment of the present invention will now be described. In the present embodiment, a timer for causing a clock signal utilization circuit to be on standby during the period until the operation of the oscillator is stabilized after the oscillator has been selected as in the first embodiment, is provided. The clock signal utilization circuit is the circuit that uses the clock signal of the oscillator. The timer measures the standby time until the oscillator is stabilized after the oscillator has started operation in response to the oscillator selection signal from the selection signal generation circuit 3. Then, after the standby time, the timer transmits an operation enable signal for starting the operation to the clock signal utilization circuit.

A configuration of an oscillator circuit in this embodiment will be described.

Figure 4A:
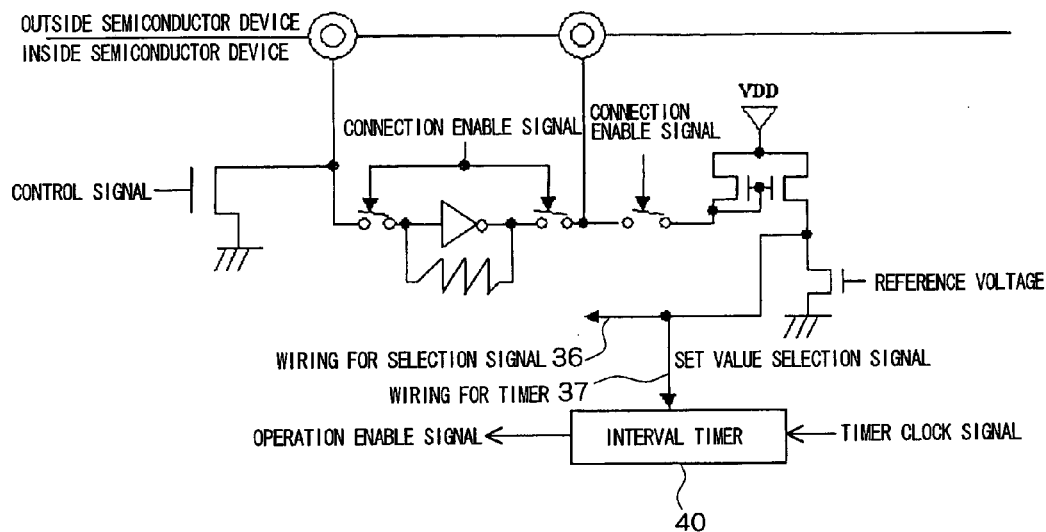
FIGS. 4a and 4b include circuit diagrams showing a configuration of a second embodiment.

FIG. 4a is a circuit diagram showing the configuration of the oscillator circuit in this embodiment.

As shown in FIG. 4a, the oscillator circuit includes an interval timer 40 in the circuit shown in FIG. 1 as an example of the above-mentioned timer. The interval timer 40 is connected to wiring for timer 37, which is branched from the wiring for selection signal 36. When the interval timer 40 receives the oscillator selection signal through the wiring for timer 37, the interval timer 40 measures the standby time until the oscillator is stabilized, in response to the oscillator selection signal, and then transmits the operation enable signal to the clock signal utilization circuit. Incidentally, the clock signal utilization circuit may be provided inside the semiconductor device or outside the semiconductor device.

Figure 4B:
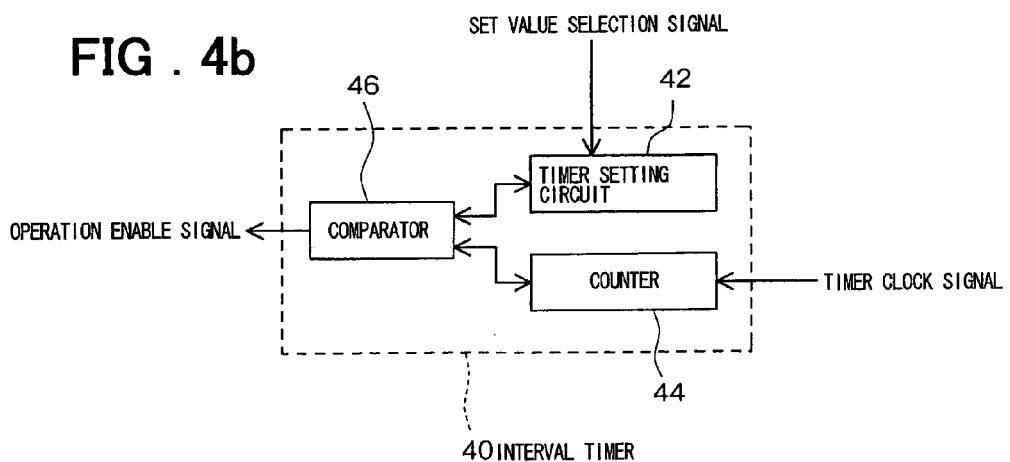

FIG. 4b is a block diagram showing a configuration of the interval timer.

As shown in FIG. 4b, the interval timer 40 includes a timer setting circuit 42 for storing set count values indicating standby times that are different depending on the respective oscillators, a counter 44 for obtaining the number of counts of a timer clock signal received from each of the oscillators, and a comparator 46 for checking whether the number of counts matches a set count value. After the selection signal generation circuit 3 has transmitted the oscillator selection signal and then the changeover switches 30 and 31 have operated as described in the first embodiment, the selected oscillator starts operation and transmits the timer clock signal to the interval timer 40. The interval timer 40 uses the timer clock signal in order to measure the standby time until the oscillator is stabilized. By estimating the standby time to be longer in advance, the oscillating waveform of the timer clock signal does not necessarily have to be stabilized.

The timer setting circuit 42 stores respective set count values for the RC oscillator and the crystal oscillator in advance. When the received oscillator selection signal is at the High level, the timer setting circuit 42 transmits the set count value for the RC oscillator to the comparator 46. When the received oscillator selection signal is at the Low level, the timer setting circuit 42 transmits the set count value for the crystal oscillator to the comparator 46. Incidentally, the oscillator selection signal received through the wiring for timer 37 becomes a set value selection signal for selecting the set count value.

The comparator 46 checks whether the set count value received from the timer setting circuit 42 matches the number of counts received from the counter 44. When the set count value matches the number of counts, the comparator 46 transmits the operation enable signal to the clock signal utilization circuit.

Next, an operation of the interval timer 40 configured above will be described.

Figure 5A:
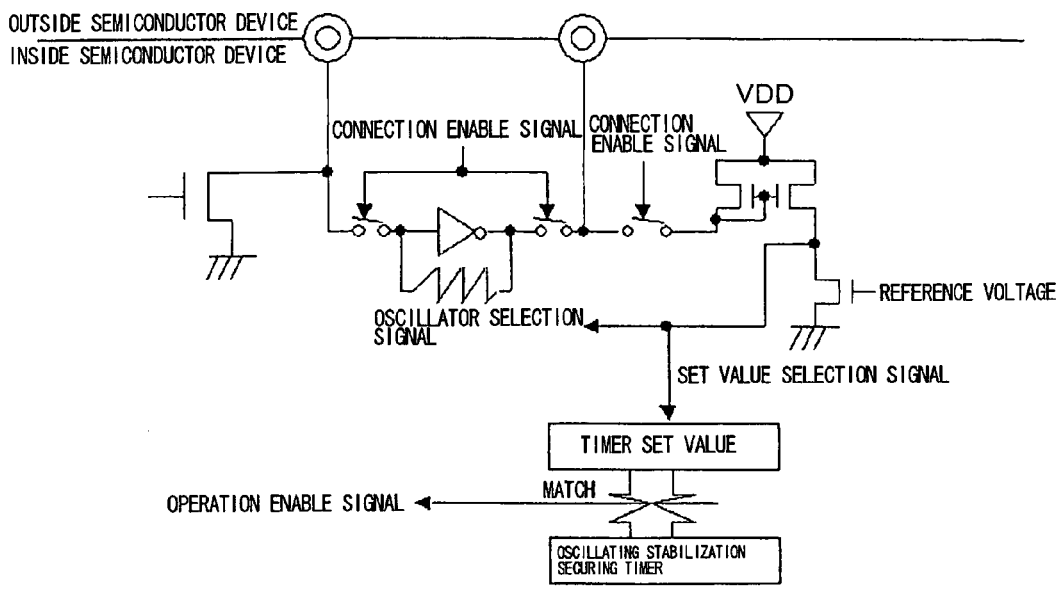
FIGS. 5a and 5b include schematic diagrams for explaining an operation of the second embodiment.
Figure 5B:
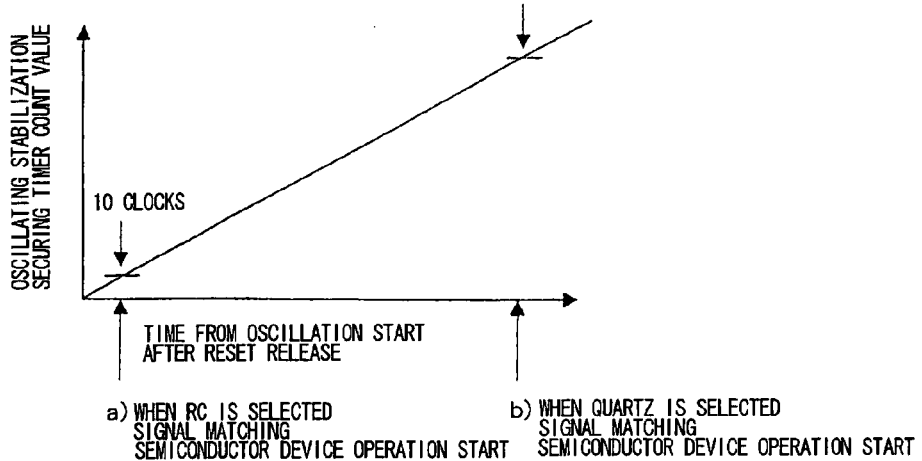

FIG. 5a is a schematic diagram showing the operation in this embodiment, and FIG. 5b is a graph for explaining the operation of the interval timer. The timer setting circuit 42 stores the set count value of "10" for the RC oscillator and the set count value of "1000" for the crystal oscillator in advance.

When the set value selection signal received from the selection signal generation circuit 3 through the wiring for timer 37 is at the Low level, the timer setting circuit 44 transmits the set count value of "1000" to the comparator 46. When the set value selection signal is at the High level, the timer setting circuit 44 transmits the set count value of "10" to the comparator 46. Further, the counter 44 increments the number of counts every time the counter 44 receives the timer clock signal and transmits the number of counts to the comparator 46.

As shown in FIGS. 5a and 5b, the comparator 46 compares the number of counts with the set count value. When the set value selection signal is at the High level and the number of counts becomes 10, its means that the number of counts matches the set count value. For this reason, a timer set value and an oscillating stabilization securing timer, schematically shown match, so that the comparator 46 transmits the operation enable signal to the clock signal utilization circuit. On the other hand, when the set value selection signal is at the Low level and the number of counts becomes 1000, it means that the number of counts matches the set count value. For this reason, the timer set value and the oscillating stabilization securing timer, schematically shown match, so that the comparator 46 transmits the operation enable signal to the clock signal utilization circuit.

In this embodiment, in order to cause the clock signal utilization circuit to be on standby until the oscillating waveform is sufficiently stabilized and then operate the clock signal utilization circuit after the oscillating waveform is sufficiently stabilized, the timer measures the standby time and when the standby time is reached, this embodiment causes the clock signal utilization circuit to start operation, as described above. For this reason, the clock signal having an unstable oscillating waveform is prevented from being entered into the clock signal utilization circuit, so that malfunction of the semiconductor device is more prevented.

Generally, it is known that the oscillating growth of the crystal oscillator is slower than that of the RC circuit, and it takes longer for the crystal oscillator to be stabilized. For this reason, when the crystal oscillator is selected as described above, the standby time is increased. When the RC resonator is selected, the standby time is reduced. Thus, an additional standby time does not need to be provided when the RC oscillator is selected, so that the time for starting the operation of the semiconductor device including the clock signal utilization circuit can be optimized.

Third Embodiment

The third embodiment of the present invention will now be described. In this embodiment, a latch circuit is provided for the configuration shown in the first embodiment, thereby hold the oscillator selection signal.

Figure 6:
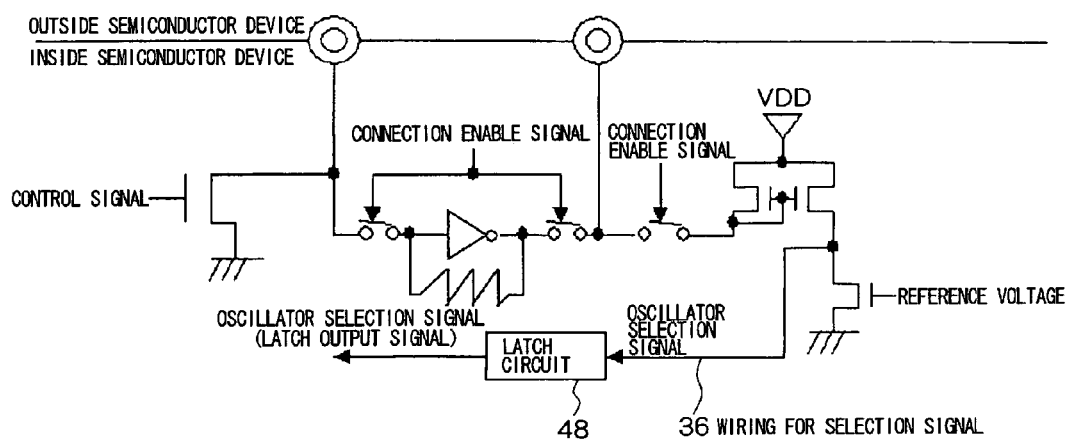
FIG. 6 is a circuit diagram showing a configuration of a third embodiment.

FIG. 6 is a circuit diagram showing a configuration of an oscillator circuit in this embodiment.

As shown in FIG. 6, the oscillator circuit has the configuration in which a latch circuit 48 for holding the oscillator selection signal is provided for the circuit in the first embodiment. The latch circuit 48 is provided between the selection signal generation circuit 3 and the changeover switches 30 and 31 shown in FIG. 1. The changeover switches 30 and 31 operate according to the oscillator selection signal output from the latch circuit 48 and connect the crystal oscillating circuit 12 or the RC oscillating circuit 18 to the connection terminals 10a and 10b in response to the oscillator selection signal.

In the present embodiment, after the selection signal generation circuit 3 has transmitted the oscillator selection signal to the latch circuit 48, the latch circuit 48 holds the oscillator selection signal even if the reset signal is turned off. Thus, the operation of the changeover switches 30 and 31 becomes possible, so that the oscillator is selected. For this reason, the reset signal should only be ON until the latch circuit 48 receives the oscillator selection signal, so that there is no need to strictly set the operation timing of the changeover switches 30 and 31 and the timing of turning off the reset signal. Thus, time and effort for circuit design can be reduced.

Fourth Embodiment

The fourth embodiment of the present invention will now be described. In the present embodiment, the timer in the second embodiment and the latch circuit in the third embodiment are applied to the first embodiment.

A configuration of an oscillator circuit in this embodiment will be described. Incidentally, same reference numerals are assigned to the configurations that are the same as the configurations shown in the first to third embodiments, and detailed description of them will be omitted.

Figure 7:
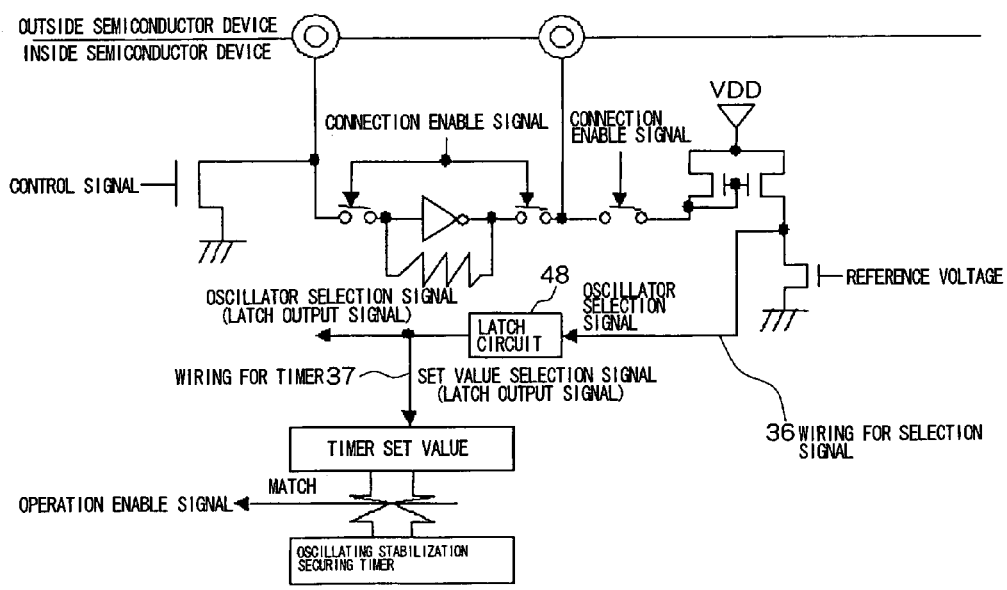
FIG. 7 is a schematic diagram for explaining a configuration of a fourth embodiment.

FIG. 7 is a schematic diagram showing the configuration of the oscillator circuit in this embodiment.

As shown in FIG. 7, in the oscillator circuit, the interval timer 40 is provided for the circuit shown in FIG. 6. The interval timer 40 is connected to the wiring for timer 37 branched from the wiring for selection signal 36 connected to the latch circuit 48. The latch circuit 48 transmits the oscillator selection signal held therein to the changeover switches 30 and 31 through the wiring for selection signal 36 and transmits the set value selection signal to the interval timer 40 through the wiring for timer 37.

In the present embodiment, after the selection signal generation circuit 3 has transmitted the oscillator selection signal to the latch circuit 48, the latch circuit 48 holds the oscillator selection signal even if the reset signal is turned off. Thus, not only the operation of the changeover switches 30 and 31 becomes possible, but also the clock signal with a stable output waveform is supplied to the semiconductor device by providing the standby time by the timer. For this reason, malfunction of the semiconductor device is further prevented.

Fifth Embodiment

In this embodiment, either of the oscillator circuits in the first to fourth embodiments is applied to the semiconductor device. A microcomputer as one type of the semiconductor device is disclosed in Japanese Patent Kokai Publication No. JP-P2000-112921A, for example.

A configuration of the microcomputer provided with either of the oscillator circuits in the first to fourth embodiments will be described. Since the configuration of the microprocessor is disclosed in the above Japanese Patent Kokai Publication No. JP-P2000-112921A, its detailed description will be omitted.

Figure 8:
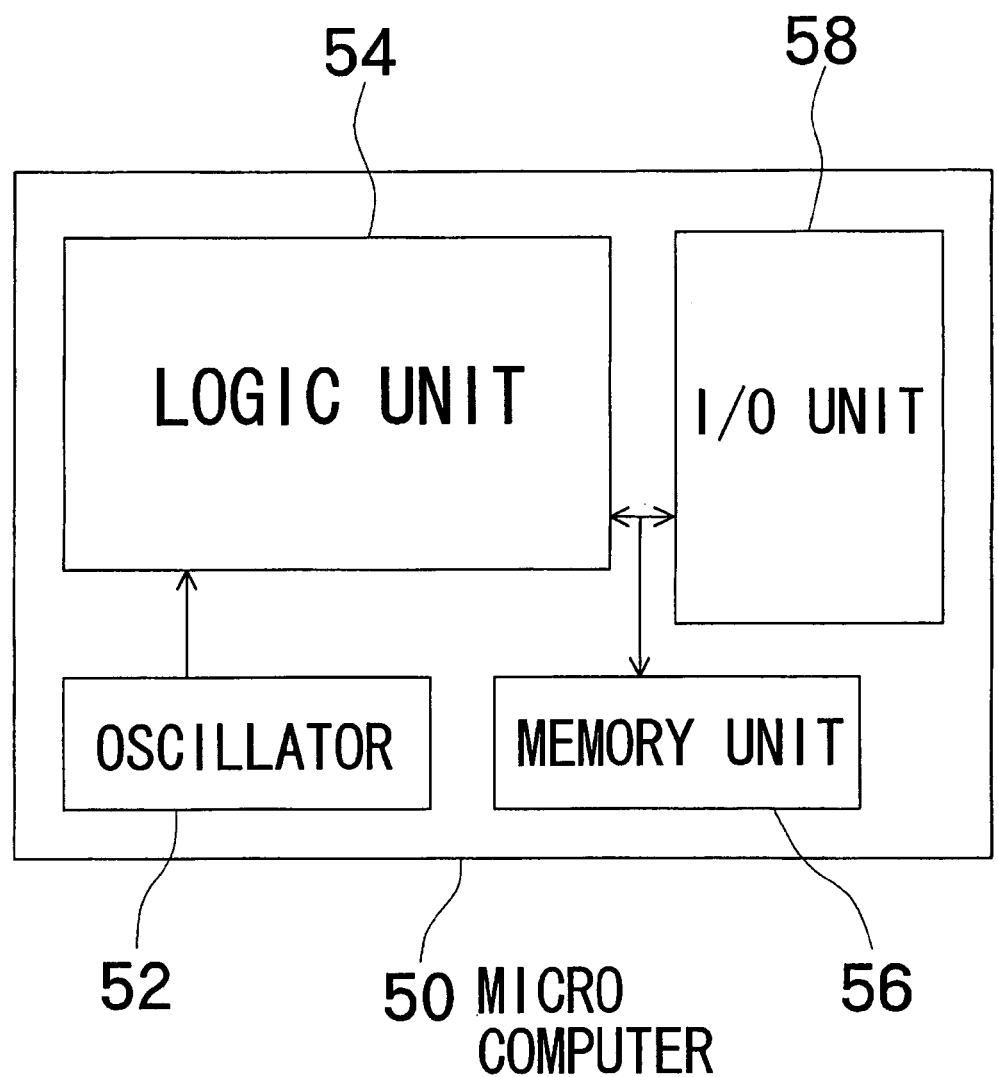
FIG. 8 is a block diagram showing a configuration of a fifth embodiment.
Figure 9:
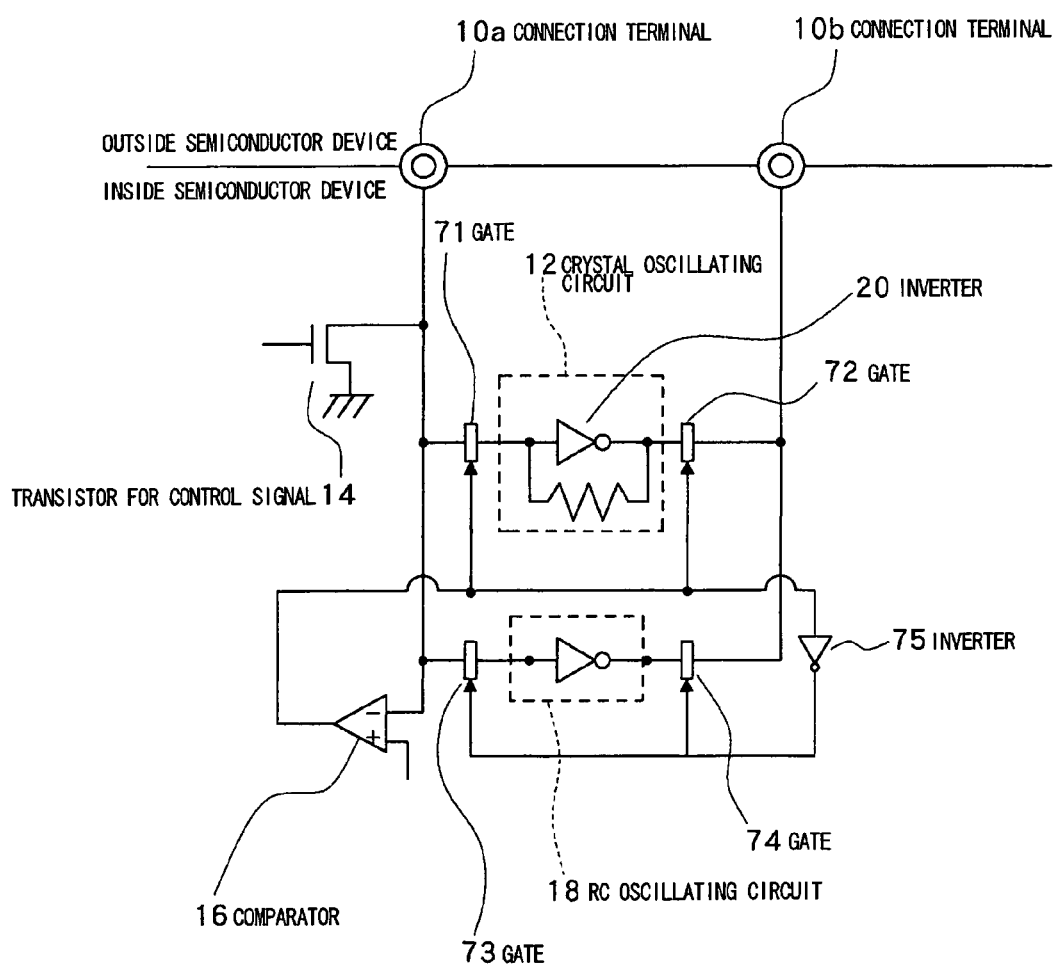
FIG. 9 is a circuit diagram showing an example of a configuration of a conventional oscillator circuit.
Figure 10A:
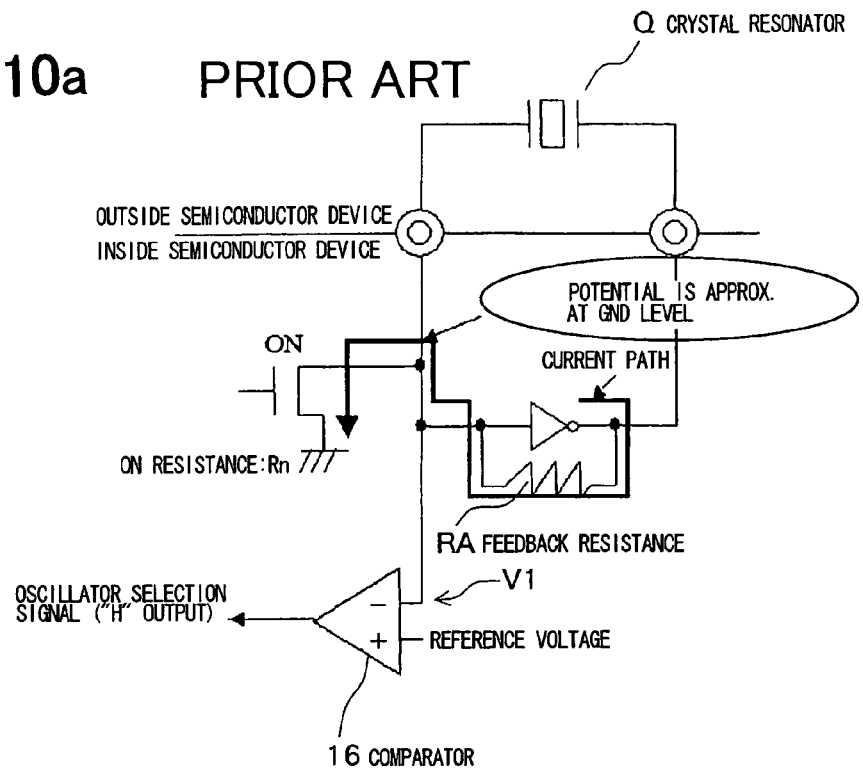
FIGS. 10a and 10b include schematic diagrams for explaining an operation of the oscillator circuit shown in FIG. 9.
Figure 10B:
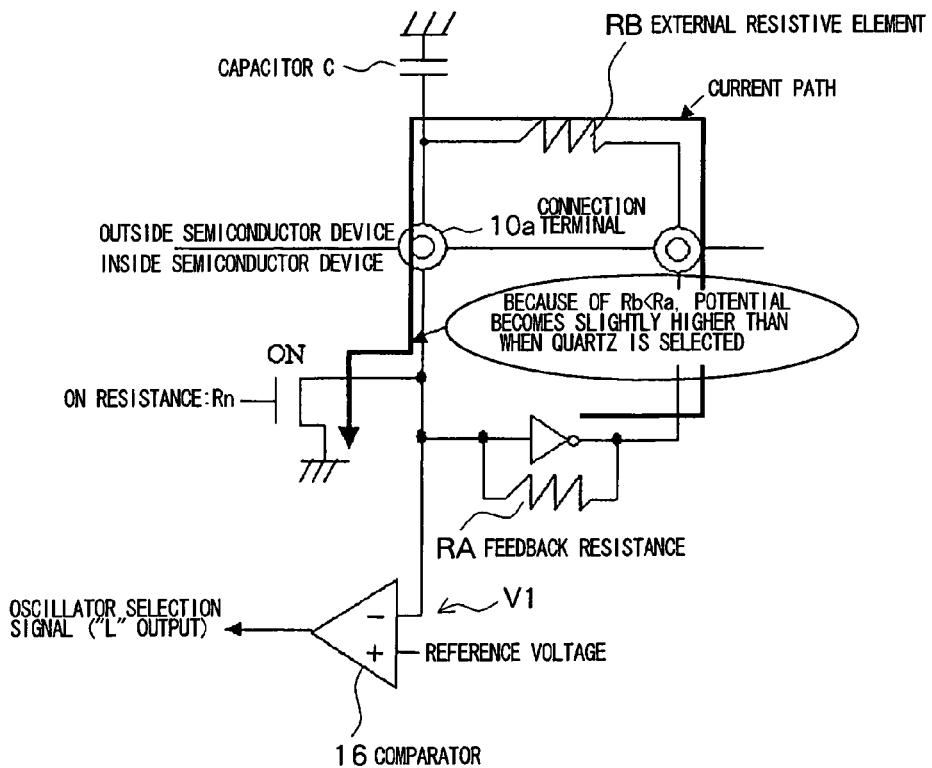
Figure 11:
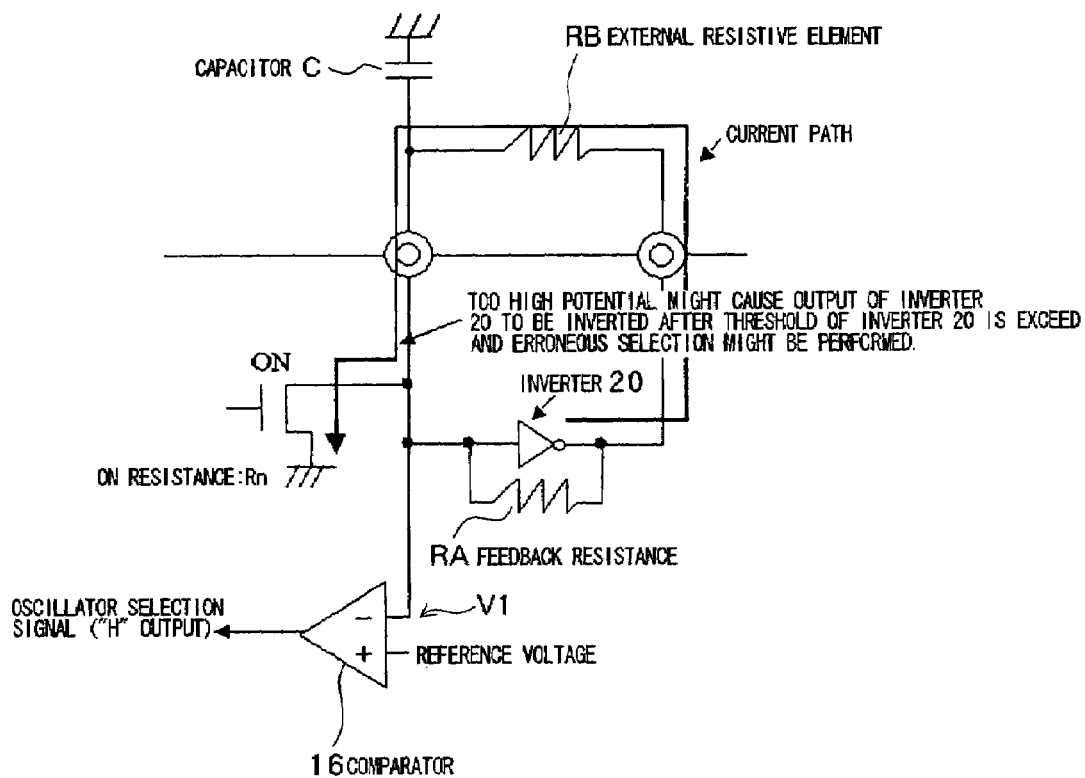
FIG. 11 is a diagram for explaining the relationship between an external resistive element and a comparator input potential in the oscillator circuit shown in FIG. 9.
Figure 12:
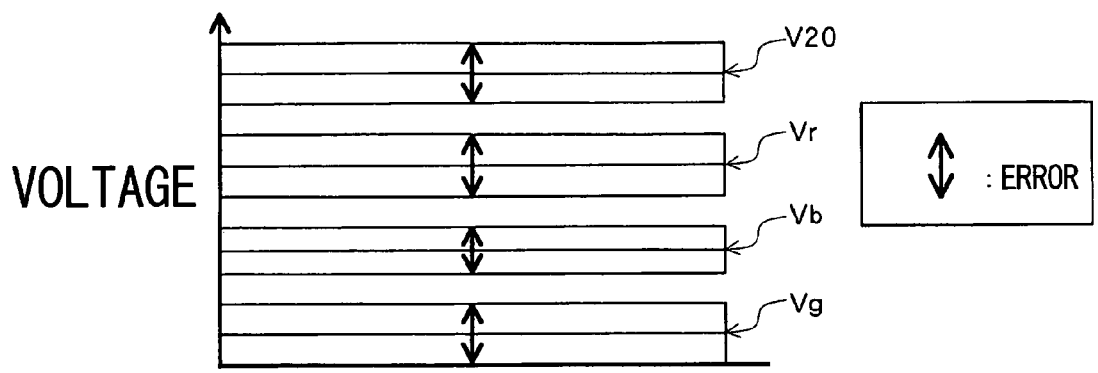
FIG. 12 is a graph showing reference voltage setting conditions of the oscillator circuit shown in FIG. 9.

FIG. 8 is a block diagram showing an example of the configuration of the microprocessor.

A microprocessor 50 shown in FIG. 8 includes an oscillator 52 that includes the above-mentioned oscillator circuit, a logic unit 54 that includes a CPU (Central Processing Unit), a memory unit 56 for storing programs and data, and an I/O unit 58 for performing data reception and transmission with an external device. The logic unit 54 becomes the above-mentioned clock signal utilization circuit.

By applying either of the oscillator circuits in the first to fourth embodiment to the oscillator 52 of the microprocessor 50 as in this embodiment, the occurrence of a malfunction of the logic unit 54 is more It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An oscillator circuit with an RC circuit or a crystal resonator connected thereto as an external component, for generating a clock signal using said RC circuit or said crystal resonator, said RC circuit comprising a resistive element and a capacitor element, said oscillator circuit comprising:
    a crystal oscillating circuit for being connected in parallel with said crystal resonator and for generating the clock signal using said crystal resonator;
    an RC oscillating circuit for being connected in parallel with said resistive element and for generating the clock signal using said RC circuit;
    a control signal generation circuit for bringing one terminal of said external component to a ground potential in response to input of a reset signal;
    a switch circuit for connecting said crystal oscillating circuit to said crystal resonator in parallel upon receipt of a first signal and connecting said RC oscillating circuit to said resistive element in parallel upon receipt of a second signal, said first signal being a selection signal for operating said crystal oscillating circuit and said second signal being a selection signal for operating said RC oscillating circuit; and
    a selection signal generation circuit for supplying the first signal to said switch circuit when a current flowing through said external component is less than a predetermined value and supplying the second signal to said switch circuit when the current is not less than the predetermined value, said selection signal generation circuit being connected to the other terminal of said external component in response to input of the reset signal.

2. The oscillator circuit according to claim 1, wherein said selection signal generation circuit comprises:
    a first transistor having a drain electrode supplied with a power supply potential, a source electrode connected to the other terminal of said external component, and a gate electrode connected to said source electrode;
    a second transistor having a drain electrode supplied with the power supply potential, a source electrode connected to said switch circuit, and a gate electrode connected to said gate electrode of said first transistor; and
    a third transistor having a drain electrode connected to said source electrode of said second transistor, a source electrode connected to the ground potential, and a gate electrode supplied with a reference voltage, the reference voltage being a voltage for turning on said third transistor.

3. The oscillator circuit according to claim 2, wherein the reference voltage has a value exceeding a threshold voltage of said third transistor.

4. The oscillator circuit according to claim 1, wherein said switch circuit includes:
    a first changeover switch having a control end connected to an output end of said selection signal generation circuit and being controlled by the selection signal output from said selection signal generation circuit so as to connect the one terminal of the external component either to one end of said RC oscillating circuit or to one end of said crystal oscillating circuit; and
    a second changeover switch having a control end connected to said output end of said selection signal generation circuit and being controlled by the selection signal output from said selection signal generation circuit so as to connect the other terminal of the external component either to the other end of said RC oscillating circuit or to the other end of said crystal oscillating circuit.

5. The oscillator circuit according to claim 1, further comprising a switch provided between the other terminal of said external component and an input end of said selection signal generation circuit and receiving a control signal at a control end thereof for being on/off controlled by the control signal.

6. The oscillator circuit according to claim 4, further comprising:
    a first switch provided between the one terminal of said external component and said first changeover switch and on/off controlled by a control signal supplied to a control end thereof; and
    a second switch provided between the other terminal of said external component and said second changeover switch and on/off controlled by a control signal supplied to a control end thereof; wherein when said first and second switches are in an off state, said RC oscillating circuit and said crystal oscillating circuit are disconnected from the oscillator circuit.

7. The oscillator circuit according to claim 1, further comprising a latch circuit for holding said selection signal, said latch circuit being provided between said selection signal generation circuit and said switch circuit.

8. The oscillator circuit according to claim 1, further comprising a timer for providing a standby time for an operation of a clock signal utilization circuit until the clock signal is stabilized, said clock signal utilization circuit being a circuit utilizing the clock signal.

9. The oscillator circuit according to claim 8, further comprising a latch circuit for holding said selection signal, said latch circuit being provided between said selection signal generation circuit and said switch circuit, wherein said timer receives the selection signal output from said latch circuit.

10. The oscillator circuit according to claim 8, wherein said timer comprises:
    a timer setting circuit for storing a plurality of count values of the standby time and specifying one of the set count values in response to the selection signal received, said set count values being different according to whether said external component is said crystal resonator or said RC circuit;
    a counter for obtaining a number of counts of the clock signal; and
    a comparator for checking whether the number of counts matches said one of the set count values and transmitting to said clock signal utilization circuit a signal for starting an operation of said clock signal utilization circuit when said one of the set count values matches the number of counts.

11. The oscillator circuit according to claim 10, wherein the set count value when the selection signal is the first signal is larger than the set count value when the selection signal is the second signal.

12. A semiconductor integrated circuit device comprising:
    the oscillator circuit as set forth in claim 1; and
    connection terminals for connecting said external component thereto.

* * * * *